United States Patent
Lee

(10) Patent No.: US 9,412,796 B2
(45) Date of Patent: *Aug. 9, 2016

(54) HIGH-ACCURACY OLED TOUCH DISPLAY PANEL STRUCTURE

(71) Applicant: SuperC-Touch Corporation, New Taipei (TW)

(72) Inventor: Hsiang-Yu Lee, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 86 days.

This patent is subject to a terminal disclaimer.

(21) Appl. No.: 14/300,897

(22) Filed: Jun. 10, 2014

(65) Prior Publication Data

US 2014/0361277 A1  Dec. 11, 2014

(30) Foreign Application Priority Data

Jun. 10, 2013 (TW) .............................. 102210870 U

(51) Int. Cl.
*G06F 3/041* (2006.01)
*H01L 27/32* (2006.01)
*G06F 3/047* (2006.01)
*G06F 3/044* (2006.01)

(52) U.S. Cl.
CPC .............. *H01L 27/323* (2013.01); *G06F 3/044* (2013.01); *G06F 3/047* (2013.01); *G06F 3/0412* (2013.01); *G06F 2203/04111* (2013.01)

(58) Field of Classification Search
CPC .................................................. G06F 3/0412
USPC ...................................................... 345/173
See application file for complete search history.

(56) References Cited

U.S. PATENT DOCUMENTS

| 2009/0322702 A1* | 12/2009 | Chien | G06F 3/044 345/174 |
|---|---|---|---|
| 2010/0156827 A1* | 6/2010 | Joo | G02F 1/13338 345/173 |
| 2012/0105337 A1* | 5/2012 | Jun | G06F 3/0412 345/173 |
| 2012/0162584 A1* | 6/2012 | Chang | G06F 3/0412 349/106 |
| 2013/0242211 A1* | 9/2013 | Lee | G06F 3/0412 349/12 |
| 2013/0314371 A1* | 11/2013 | Lee | G06F 3/0412 345/174 |
| 2014/0078104 A1* | 3/2014 | Lee | G06F 3/044 345/174 |
| 2014/0375911 A1* | 12/2014 | Lee | G06F 3/0412 349/12 |
| 2015/0009426 A1* | 1/2015 | Lee | G02F 1/13338 349/12 |
| 2015/0042612 A1* | 2/2015 | Lee | G02F 1/13338 345/174 |
| 2015/0048346 A1* | 2/2015 | Lee | H01L 27/323 257/40 |

* cited by examiner

*Primary Examiner* — Jason Olson
(74) *Attorney, Agent, or Firm* — Muncy, Geissler, Olds & Lowe, P.C.

(57) ABSTRACT

A high-accuracy OLED touch display panel structure includes an upper substrate, a lower substrate, an OLED layer configured between the upper and lower substrates, a sensing electrode layer, a thin film transistor and wiring layer, a cathode layer, and an anode layer. The sensing electrode layer has a plurality of sensing conductor lines for sensing an approaching external object. The thin film transistor and wiring layer includes a plurality of gate lines, a plurality of source lines, and a plurality of wirings. The plurality of sensing conductor lines are disposed corresponding to positions of the plurality of gate lines and the plurality of source lines.

15 Claims, 16 Drawing Sheets

HIGH-ACCURACY OLED TOUCH DISPLAY PANEL STRUCTURE

BACKGROUND OF THE INVENTION

1. Field of the Invention

The present invention relates to a structure of touch display panel and, more particularly, to a high-accuracy OLED touch display panel structure.

2. Description of Related Art

In recent year, the flat panel display industry has been rapidly developed, and many products have also been made in pursuit of light weight, thinness, small volume and fine image quality for developing several types of flat-panel displays to replace traditional cathode ray tube display (CRT). FIG. 1 schematically illustrates the types of known display panels. As shown in FIG. 1, the flat panel display includes liquid crystal display (LCD), plasma display panel (PDP), organic light emitting diode (OLED) display, field emission display (FED), and vacuum fluorescence display (VFD).

Among these types of flat panel displays, the organic light emitting diode display (OLED) technology is the one with great potential. OLED was first published by Eastman Kodak Co. in 1987. It has the features of thinness, light weight, self-illumination, low driving voltage, high efficiency, high contrast, high color saturation, fast response, flexibility, etc., and is therefore deemed as positively evaluated display technology following the TFT-LCD. In recent years, due to the development of mobile communications, digital products and digital televisions, the demand for high-quality full-color flat-panel displays is rapidly increased. The OLED display is provided with not only the advantages of LCD display including thinness, power-saving, and full-color display, but also the features of wide viewing angle, self-illumination, and fast response that are better than LCD.

FIG. 2 schematically illustrates the basic structure of conventional OLED display. The OLED display 200 includes a cathode layer 210, an OLED layer 220, an anode layer 230, a thin film transistor layer 240, a lower substrate 250, and an upper substrate 260, wherein the OLED layer 220 further includes a hole transporting layer (HTL) 221, an emitting layer 223, and an electron transporting layer (ETL) 225.

The light-emitting principle of OLED is such that the electrons and electric holes are injected from the cathode layer 210 and the anode layer 230 respectively by applying electric field and, after the electric holes pass through the electric hole transport sub-layer 221 and electrons pass through the electron transport sub-layer 225, the electrons and electric holes enter the light-emitting layer 223 with fluorescent characteristics and then are combined to produce excited photons, which immediately release energy and return to the ground state. The released energy will generate different colors of light based on different luminescent materials, so as to cause OLED to emit light.

The conventional OLED display 200 has a cathode layer 210 disposed below the upper substrate 260. The cathode layer 210 can be used to isolate the noise from the top of the upper substrate 260 and receive current of the pixel electrodes of the anode layer 230, so as to control the illumination of light emitting layer 223.

The conventional touch display panel includes a touch panel and a display unit overlapped with the touch panel. The touch panel is configured as an operation interface. The touch panel is transparent so that an image generated by the display unit can be viewed directly by a user without being sheltered by the touch panel. Such well known skill of the touch panel may increase additional weight and thickness of the touch display panel, and may further reduce the light penetration rate, and increase reflectance and haze of the touch display panel.

On-cell and in-cell touch technology are invented to overcome the drawbacks of traditional touch technology described above. The on-cell technology is to dispose a touch sensor on a thin film and then bond the thin film onto the upper one of the upper glass substrate layer. The in-cell touch technology is provided to integrate the touch sensor within the display unit so that the display unit is provided with the ability of the touch panel. Therefore, the touch display panel does not need to be bonded with an additional touch panel so as to simplify the assembly procedure. Such skill is generally developed by display panel manufactures.

In view of the sensing method, the capacitive touch panel is employed to convert the capacitance change caused by the arranged transparent electrodes combined with the static electricity with respect to human body into current or voltage, so as to detect the touch coordinates. FIG. 3 is a schematic diagram of a conventional dual-layer transparent electrode structure, wherein the transparent electrodes are arranged according to X axis and Y axis, and different layers of transparent electrodes are separated from each other by an insulation layer, such as glass or plastic. Such a structure suffers the disadvantages of high material cost and complicated manufacturing process.

FIG. 4 is a schematic diagram of a conventional single-layer transparent electrode structure. The structure of FIG. 4 has the advantages of low material cost and simplified manufacturing process; however, it suffers the disadvantage of complicated wirings 41. Because the wirings 41 occupy most of the area, the linearity becomes unsatisfactory. The areas occupied by the wirings 41 are knows as dead areas on which a finger touch cannot be effectively detected. Therefore, it desired for the aforementioned OLED touch display panel structure to be improved.

SUMMARY OF THE INVENTION

The object of the present invention is to provide a high-accuracy OLED touch display panel structure, in which a plurality of wiring segments arranged in the first direction and a plurality of wiring segments arranged in the second direction are formed on a thin film transistor and wiring layer, such that there is no need to arrange wirings on a sensing electrode layer for the sensing touch pattern structure on the sensing electrode layer, so as to effectively reduce the gap distance between sensing touch patterns thereby decreasing the measure of dead area and increasing sensing linearity and sensing accuracy.

To achieve the object, there is provided a high-accuracy OLED touch display panel structure, which comprises: an upper substrate; a lower substrate parallel to the upper substrate; an OLED layer configured between the upper substrate and the lower substrate; a sensing electrode layer disposed at one side of the lower substrate facing the OLED layer, sensing electrode layer having a plurality of sensing conductor lines for sensing an approaching external object; a thin film transistor and wiring layer disposed at one side of the sensing electrode layer facing the OLED layer, the thin film transistor and wiring layer including a plurality of gate lines, a plurality of source lines and a plurality of wirings, thereby driving a corresponding pixel driving circuit according to a display pixel signal and a display driving signal; a cathode layer disposed at one side of the upper substrate facing the OLED layer; and an anode layer disposed at one side of the thin film transistor and wiring layer facing the OLED layer, the anode layer including a plurality of anode pixel electrodes, each of the plurality of anode pixel electrodes being connected to a source or drain of a corresponding pixel driving transistor, wherein the plurality of sensing conductor lines are disposed corresponding to positions of the plurality of gate lines and the plurality of source lines.

DETAILED DESCRIPTION OF THE PREFERRED EMBODIMENT

Figure 1:
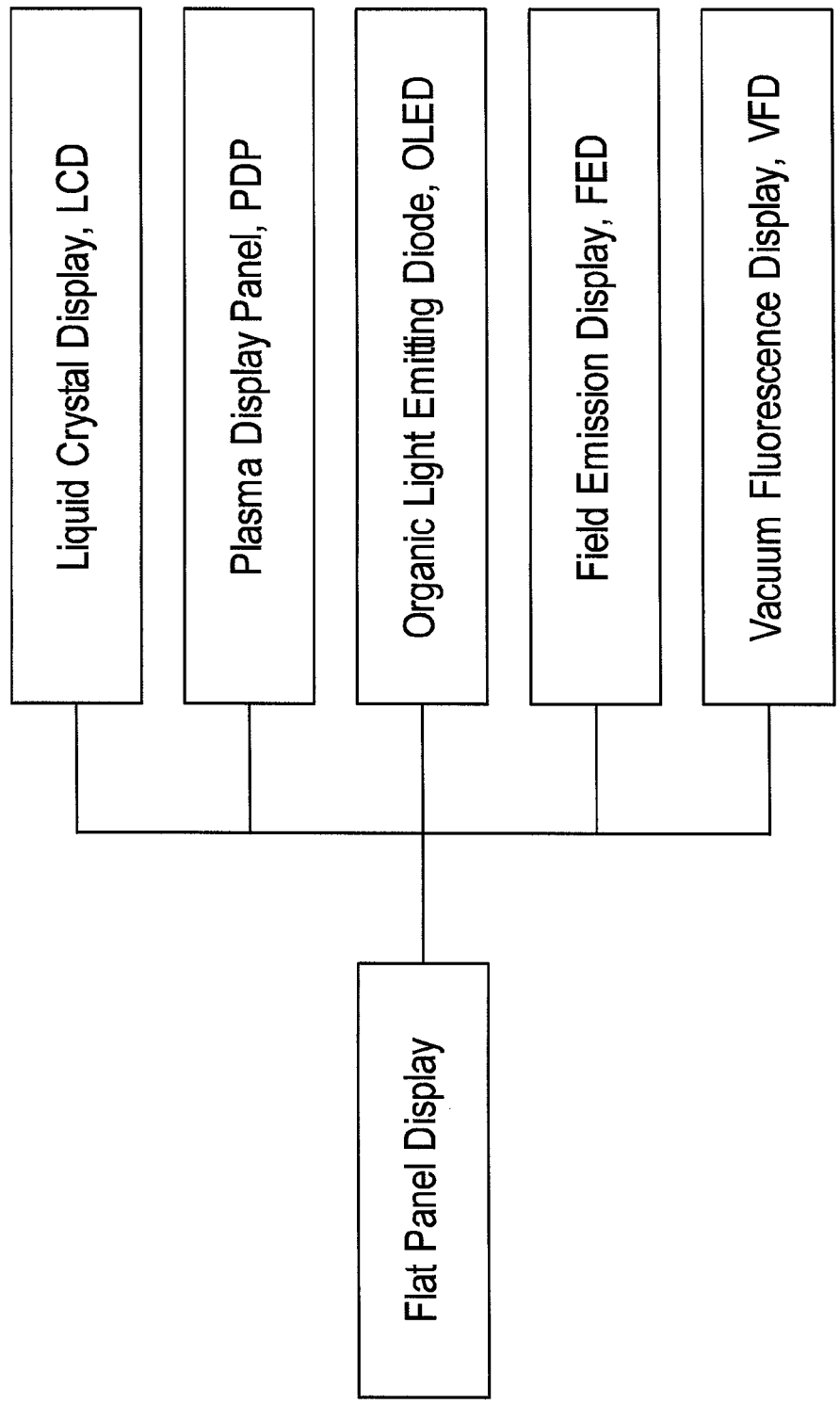
FIG. 1 schematically illustrates the types of conventional display panel.
Figure 2:
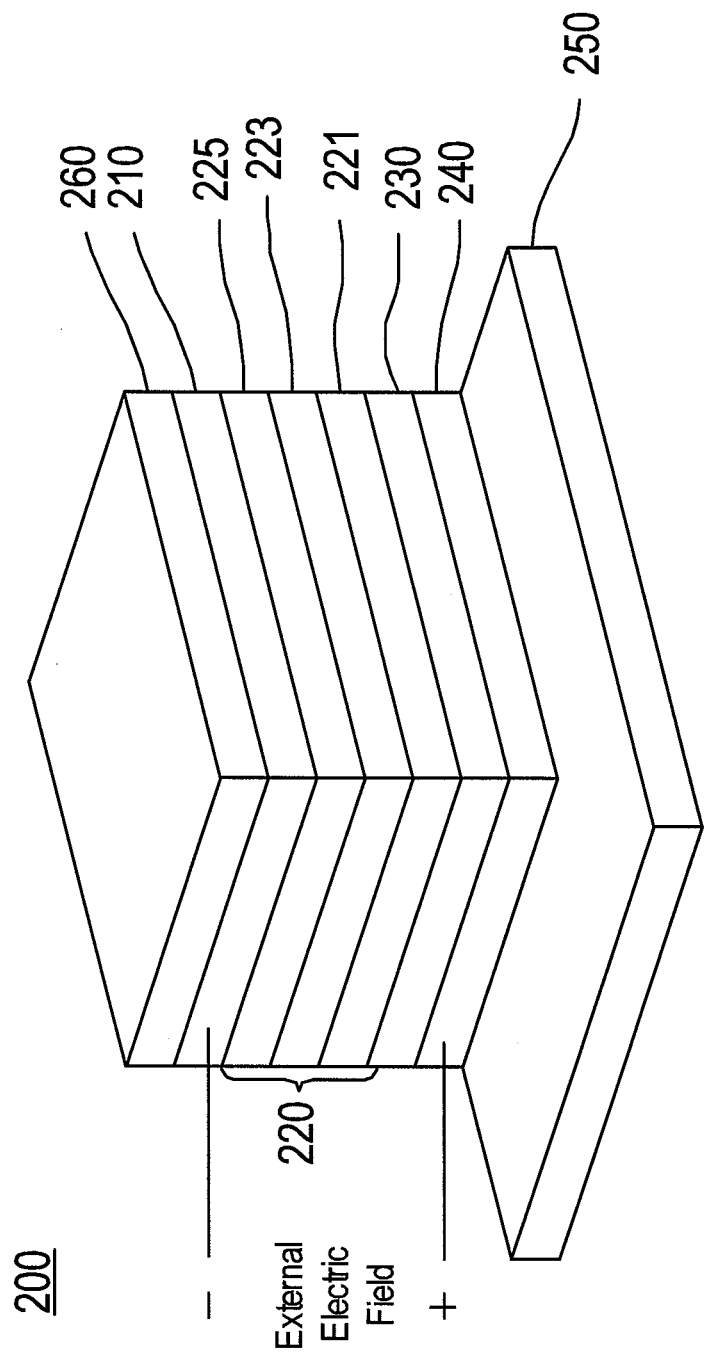
FIG. 2 schematically illustrates the basic structure of a conventional OLED.
Figure 3:
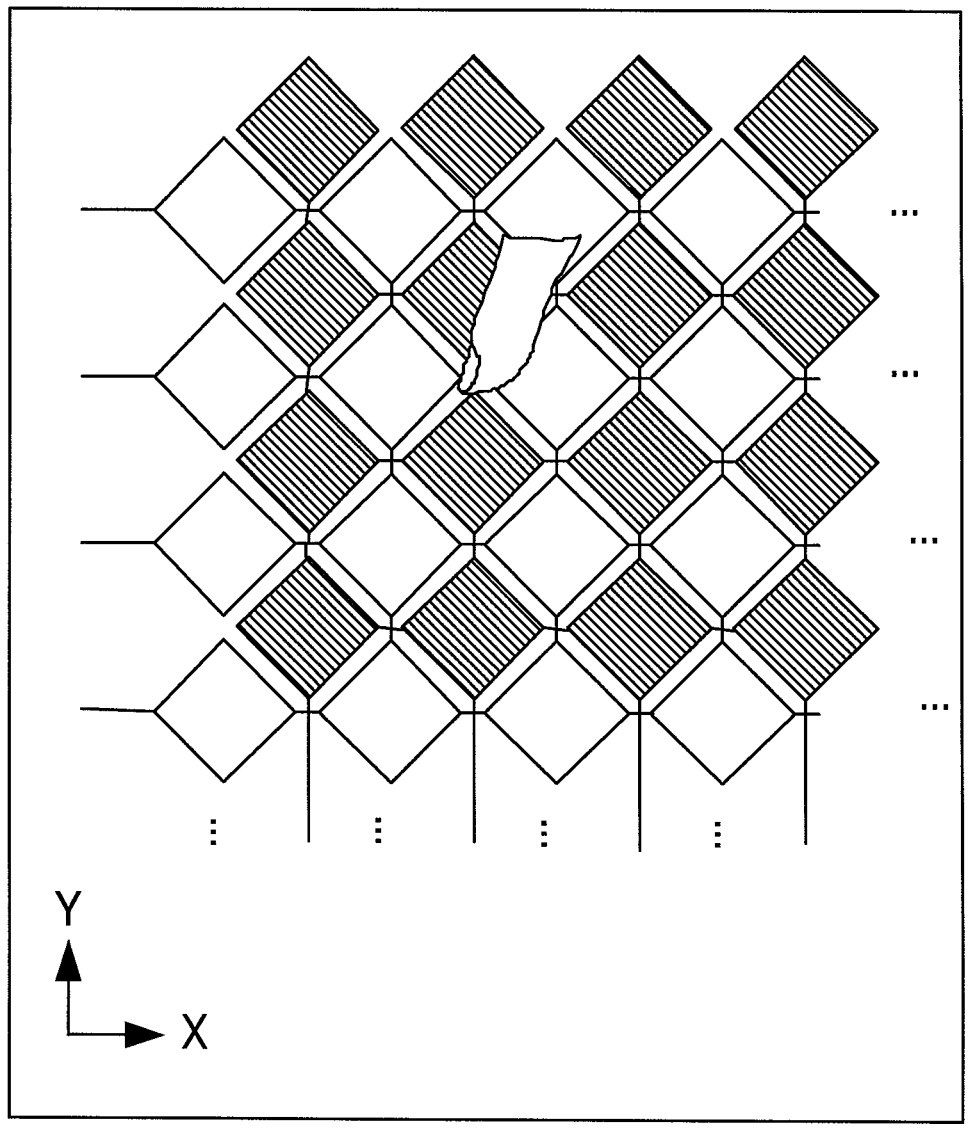
FIG. 3 is a schematic diagram of a conventional dual-layer transparent electrode structure.
Figure 4:
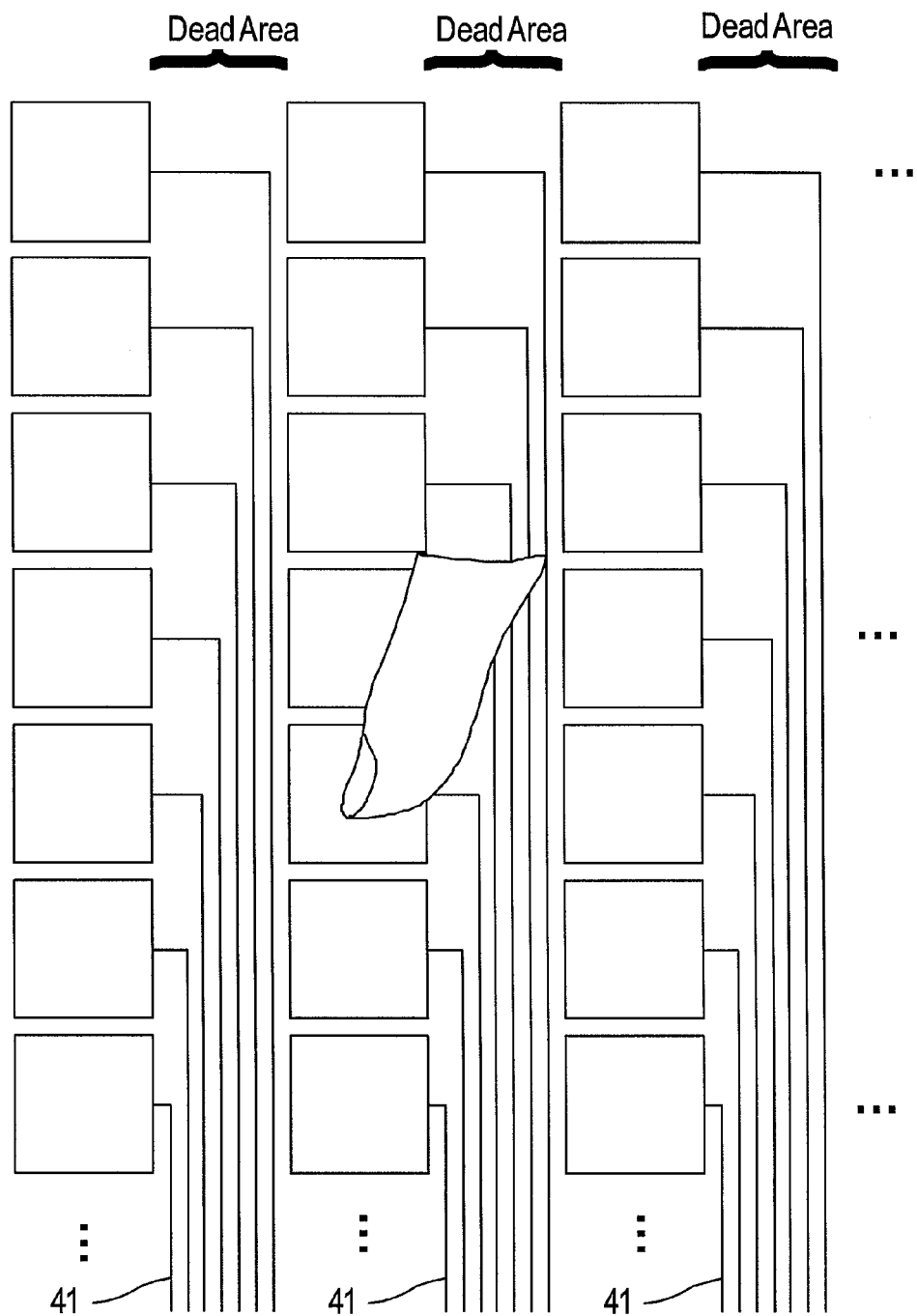
FIG. 4 is a schematic diagram of a conventional single-layer transparent electrode structure.
Figure 5:
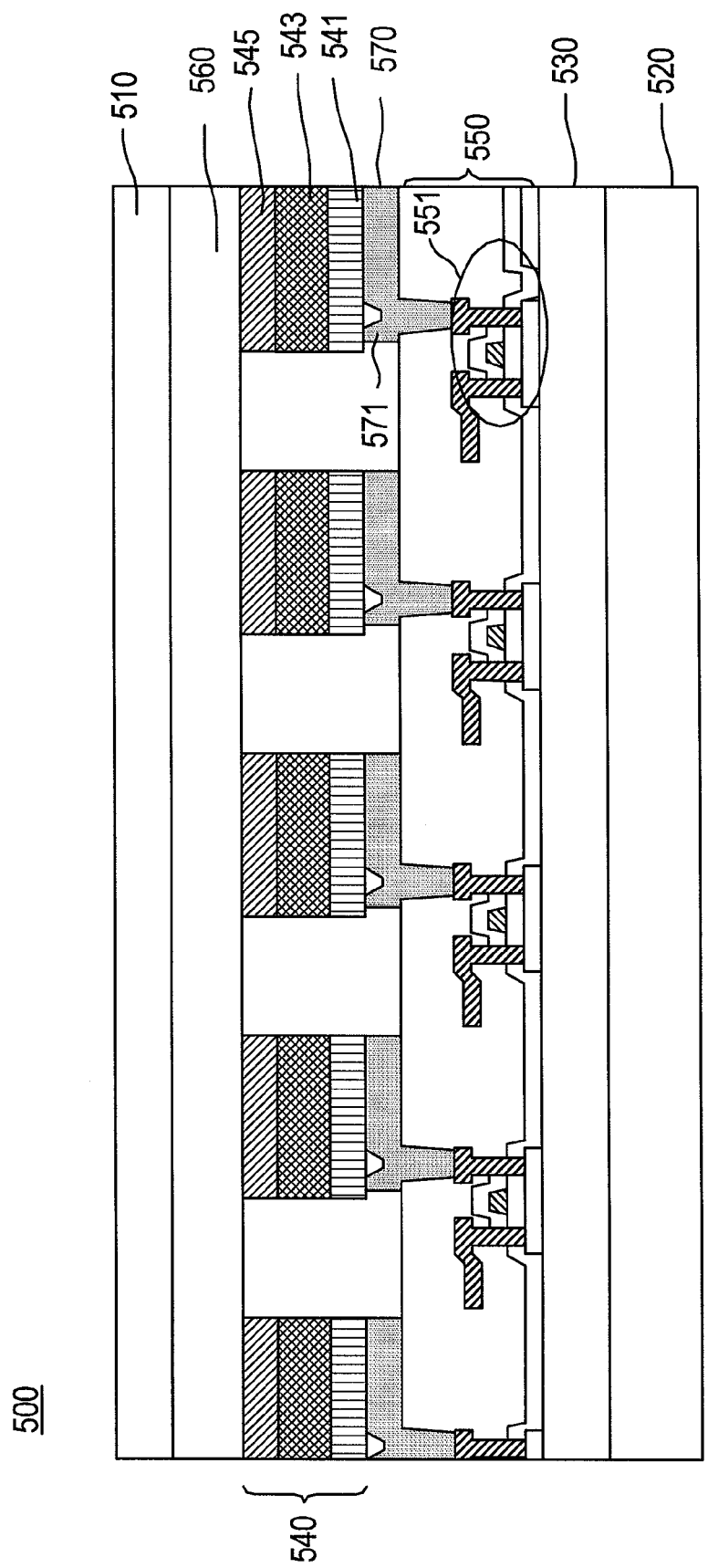
FIG. 5 is a cross sectional view of the high-accuracy OLED touch display panel structure in accordance with the present invention.

The present invention relates to a high-accuracy OLED touch display panel structure. FIG. 5 is a cross sectional view of the high-accuracy OLED touch display panel structure 500 in accordance with the present invention. The high-accuracy OLED touch display panel structure 500 includes an upper substrate 510, a lower substrate 520, a sensing electrode layer 530, an OLED layer 540, a thin film transistor and wiring layer 550, a cathode layer 560, and an anode layer 570.

The upper substrate 510 and the lower substrate 520 are preferably glass substrates or plastic substrates, and are parallel to each other. The OLED layer 540 is disposed between the upper and lower substrates 510, 520.

The sensing electrode layer 530 is disposed at one side of the lower substrate 520 that faces the OLED layer 540. The sensing electrode layer 530 has a plurality of sensing conductor lines for sensing an approaching external object.

The thin film transistor and wiring layer 550 is disposed at one side of the sensing electrode layer 530 that faces the OLED layer 540. The thin film transistor and wiring layer 550 includes a plurality of gate lines (not shown), a plurality of source lines (not shown), a plurality of wirings (not shown), and a plurality of pixel driving circuits 551. Each pixel driving circuit 551 corresponds to a pixel. Based on a display pixel signal and a display driving signal, a corresponding pixel driving circuit 551 is driven so as to proceed with display operation.

According to different designs of the pixel driving circuit 551, such as 2T1C being a pixel driving circuit formed with two thin film transistors and a storage capacitor, and 6T2C being a pixel driving circuit formed with six thin film transistors and two storage capacitors, the gate of at least one thin film transistor in the pixel driving circuit is connected to a gate line (not shown). According to different designs of driving circuit, a source/drain of at least one thin film transistor in a control circuit is connected to a source line (not shown) and a source/drain of at least one thin film transistor in pixel driving circuit 551 is connected to a corresponding anode pixel electrode 571 of the anode layer 570.

The anode layer 570 is disposed at one side of the thin film transistor and wiring layer 550 facing the OLED layer 540. The anode layer 570 includes a plurality of anode pixel electrodes 571. Each of the anode pixel electrodes 571 is corresponding to one pixel driving transistor of the pixel driving circuit 551 of the thin film transistor and wiring layer 550. That is, each of the anode pixel electrodes is connected to a source/drain of the pixel driving transistor of the corresponding pixel driving circuit 551, so as to form a pixel electrode of a specific color, for example a red pixel electrode, a green pixel electrode, or a blue pixel electrode.

The cathode layer 560 is disposed at one side of the upper substrate 510 facing the OLED layer 540. That is, the cathode layer 560 is located between the upper substrate 510 and the OLED layer 540. The cathode layer 560 is formed with metal material, preferably metal material with thickness being less than 50 nm. The metal material is selectively to be combination of aluminum, silver, magnesium, calcium, potassium, lithium, indium, or combination of lithium fluoride, magnesium fluoride, lithium oxide and aluminum. Due to the thickness of the cathode layer 560 being less than 50 nm, the light generated by the OLED layer 540 can pass through it, so as to show images on the upper substrate 510. The cathode layer 560 is intact piece electrical connection, so that it can be used as a shielding. Moreover, the cathode layer 560 also receives the current coming from the anode pixel electrode 571.

In the present invention, a sensing electrode layer 530 is provided between the conventional thin film transistor layer and the lower substrate 520. Furthermore, a sensing touch pattern structure is defined on the sensing electrode layer 530, and wirings for the sensing touch pattern structure are also arranged on the thin film transistor layer, so as to form the thin film transistor and wiring layer 550 in accordance with the present invention. Therefore, there is no need to arrange a sensing electrode layer on upside of the upper glass substrate or downside of the lower glass substrate of a display panel, so as to reduce the manufacturing cost, simplify the manufacturing process and increase the yield rate. Moreover, because the wirings that connect the sensing electrode layer 530 to a touch detection circuit (not shown) are disposed on the thin film transistor and wiring layer 550, there is no need to arrange the wirings on the sensing electrode layer 530 for the sensing touch pattern structure of the sensing electrode layer 530, so as to effectively reduce the gap distance between sensing touch patterns thereby decreasing the measure of dead area and increasing sensing linearity and sensing accuracy.

Figure 6:
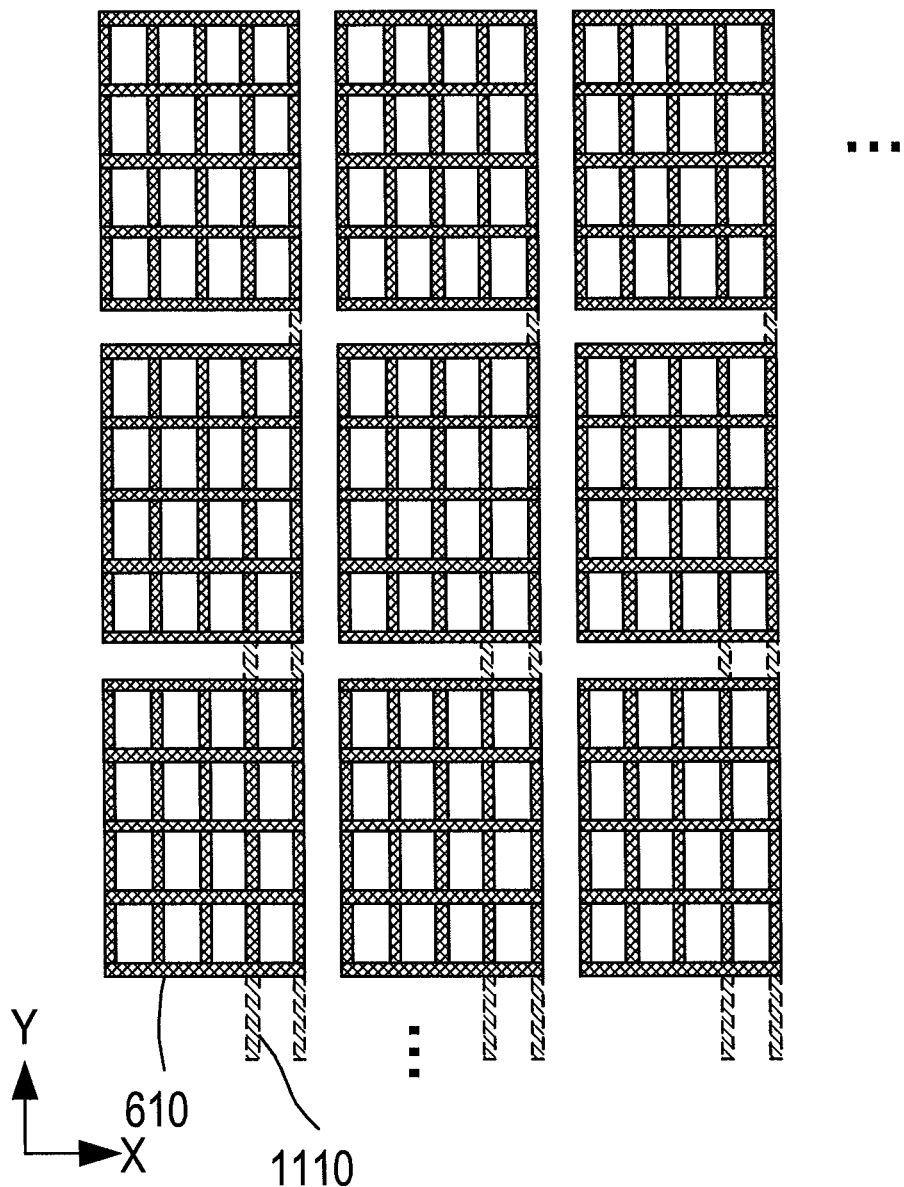
FIG. 6 schematically illustrates the sensing touch pattern structure of the sensing electrode layer in accordance with the present invention.

FIG. 6 schematically illustrates the sensing touch pattern structure of the sensing electrode layer 530 in accordance with the present invention. As shown in FIG. 6, the plurality of sensing conductor lines are divided into N quadrilateral regions 610, where N is a positive integer. The sensing conductor lines in any one of the quadrilateral regions 610 are electrically connected together while the sensing conductor lines in any two quadrilateral regions 610 are not electrically connected, so as to form a single-layered sensing touch pattern structure on the sensing electrode layer 530. Each of the quadrilateral regions 610 is formed in a rectangle, square, or rhombus shape.

The plurality of wirings of the thin film transistor and wiring layer 550 are formed with N wirings 1110. Each of the N wirings 1110 is electrically connected to a corresponding quadrilateral region 610 while any two wirings 1110 are not electrically connected. The plurality of wirings 1110 of the thin film transistor and wiring layer 550 are arranged in a first direction (X-direction) or a second direction (Y-direction), wherein the first direction is substantially vertical with the second direction.

Figure 7:
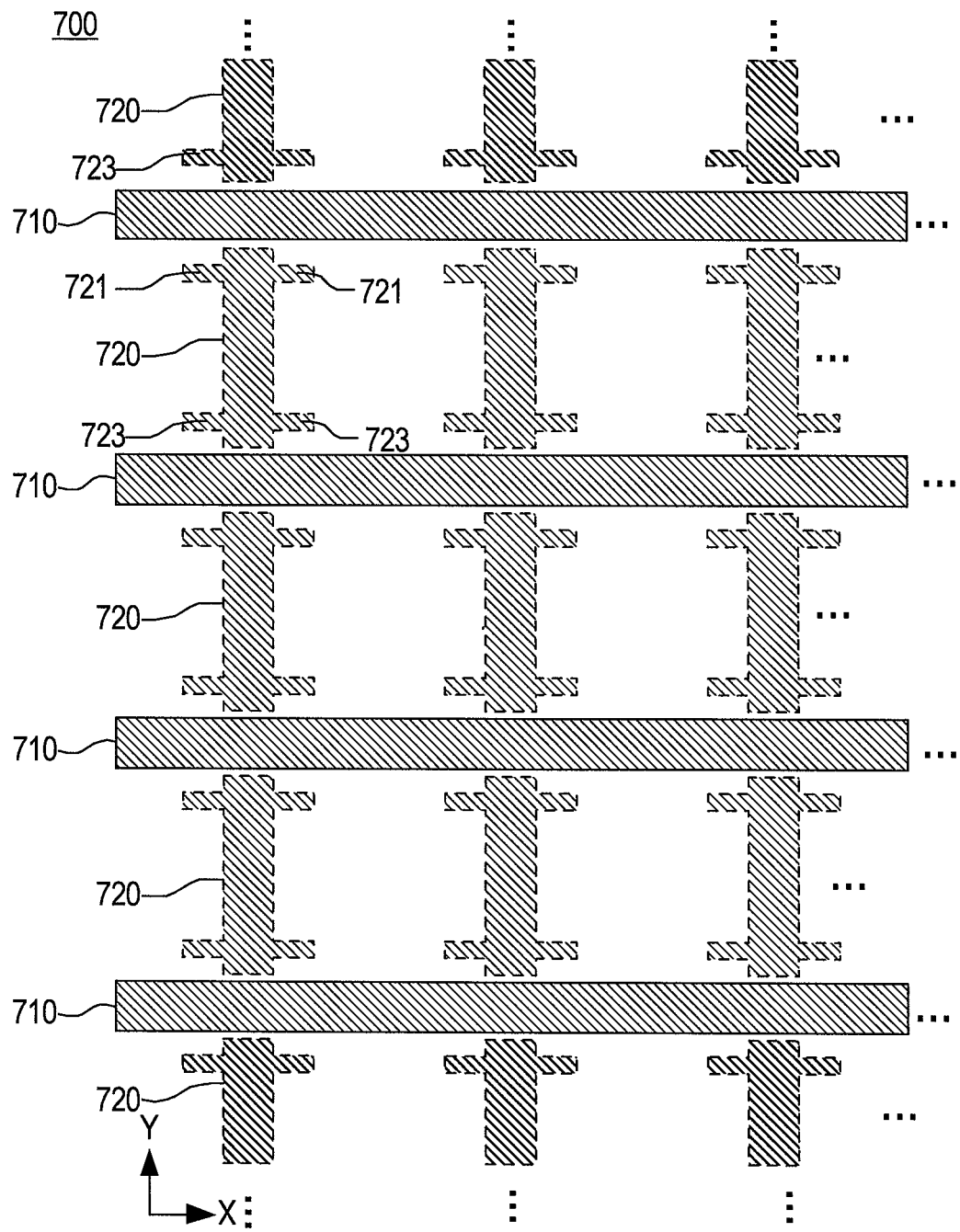
FIG. 7 schematically illustrates the gate line sub-layer in accordance with the present invention.

The thin film transistor and wiring layer 550 includes a gate line sub-layer and a source line sub-layer. FIG. 7 schematically illustrates the gate line sub-layer 700 in accordance with the present invention. The gate line sub-layer 700 has a plurality of gate lines 710 and a plurality of wiring segments 720. The plurality of gate lines 710 are arranged in the first direction (X-direction) and the plurality of wiring segments 720 are arranged in the second direction (Y-direction), wherein the plurality of wiring segments 720 arranged in the second direction are separated by the plurality of gate lines 710. More specifically, as shown in FIG. 7, the plurality of wiring segments 720 are deemed as a plurality of wiring segment lines arranged in the second direction, each wiring segment line having several wiring segments 720 aligned in the second direction while two aligned adjacent wiring segments 720 are separated by a corresponding gate line 710. Each of the plurality of wiring segments 720 arranged in the second direction includes two ends respectively having a first extension part 721 and a second extension part 723 arranged in the first direction and extended toward two sides of the wiring segment 720, in which the first direction is substantially vertical with the second direction. It is noted that FIG. 7 only shows the possible positions where the plurality of wiring segments 720 arranged in the second direction can be disposed. In actual arrangement of wirings, it is possible that only part of the positions, but not all positions, is disposed with the wiring segments 720, and thus the plurality of wiring segments 720 in FIG. 7 are shown by dotted lines.

Figure 8:
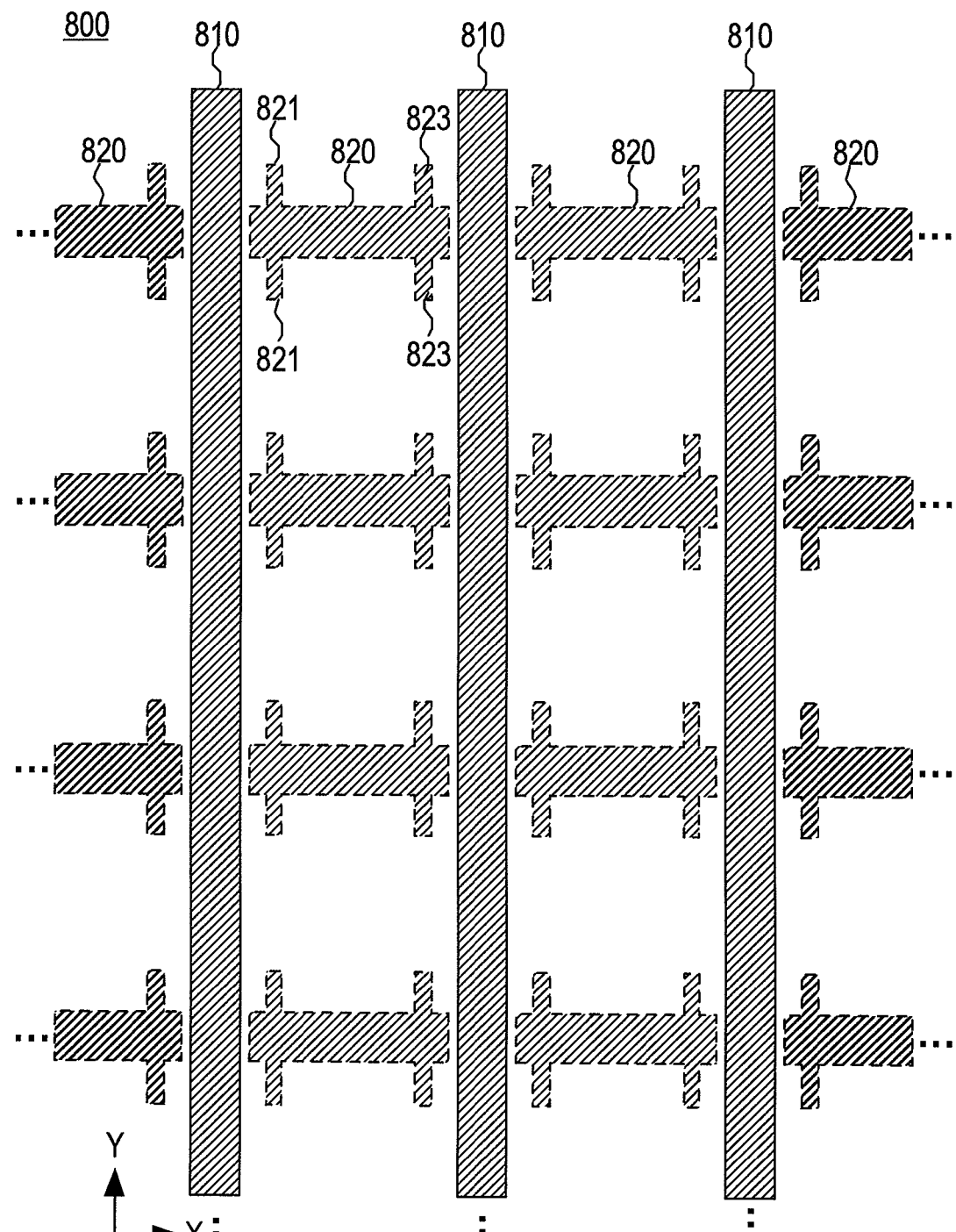
FIG. 8 schematically illustrates the source line sub-layer in accordance with the present invention.

FIG. 8 schematically illustrates the source line sub-layer 800 in accordance with the present invention. The source line sub-layer 800 is disposed at one side of the gate line sub-layer 700' facing the OLED layer 540 and has a plurality of source lines 810 and a plurality of wiring segments 820. The plurality of source lines 810 are arranged in the second direction (Y-direction) and the plurality of wiring segments 820 are arranged in the first direction (X-direction), wherein the plurality of wiring segments 820 arranged in the first direction are separated by the plurality of source lines 810. More specifically, as shown in FIG. 8, the plurality of wiring segments 820 are deemed as a plurality of wiring segment lines arranged in the first direction, each wiring segment line having several wiring segments 820 aligned in the first direction while two aligned adjacent wiring segments 820 are separated by a corresponding source line 810. Each of the plurality of wiring segments 820 arranged in the first direction includes two ends respectively having a first extension part 821 and a second extension part 823 arranged in the second direction (Y-direction) and extended toward two sides of the wiring segment 820.

As shown in FIG. 7 and FIG. 8, the line width of the wiring segment 820 arranged in the first direction is equal to the line width of the gate line 710, and the line width of the wiring segment 720 arranged in the second direction is equal to the line width of the source line 810. In other embodiments, the line width of the wiring segment 820 arranged in the first direction can be smaller than the line width of the gate line 710, and the line width of the plurality of wiring segment 720 arranged in the second direction can be smaller than the line width of the source line 810.

In the present invention, the plurality of wiring segments 720 arranged in the second direction are disposed at positions same as the positions of the source lines 810 but on different layers. Similarly, the plurality of wiring segments 820 arranged in the first direction are disposed at positions same as the positions of the gate lines 710 but on different layers. In the present invention, the plurality of wiring segments 820 arranged in the second direction and the plurality of wiring segments 720 arranged in the first direction are disposed at positions corresponding to the positions of the plurality of gate lines 710 and the plurality of source lines 810.

Figure 9:
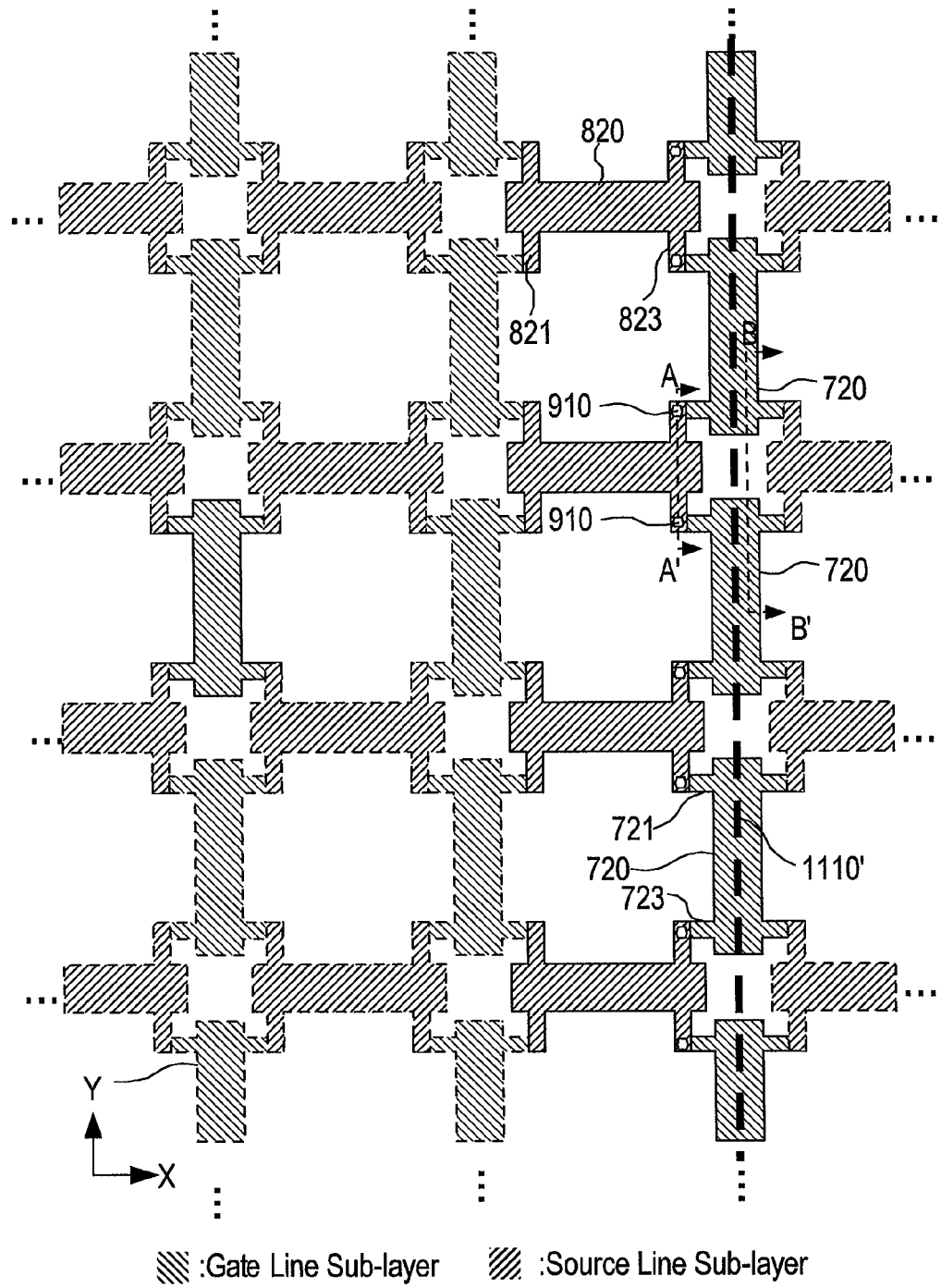
FIG. 9 schematically illustrates the electrical connection between the plurality of wiring segments arranged in the first direction and the plurality of the wiring segments arranged in the second direction in accordance with the present invention.

FIG. 9 schematically illustrates the electrical connection between the plurality of wiring segments 820 arranged in the first direction and the plurality of the wiring segments 720 arranged in the second direction in accordance with the present invention, wherein the extension parts 721, 723, 821, 823 are partially overlapped and electrically connected thereby, so as to allow the plurality of wiring segments 820 arranged in the first direction and the plurality of wiring segments 720 arranged in the second direction to form the plurality of wirings of the thin film transistor and wiring layer 550. As shown in FIG. 9, there is formed with a wiring 1110' arranged in the second direction.

With reference to FIGS. 7, 8 and 9, the plurality of the wiring segments 720 arranged in the second direction and the plurality of wiring segments 820 arranged in the first direction can respectively form a wiring 1110'. That is, the extension parts 721, 723, 821, 823 are partially overlapped and electrically connected thereby, and a set of wirings can be formed by the plurality of the wiring segments 720 arranged in the second direction and the plurality of wiring segments 820 arranged in the first direction. The set of wirings includes N wirings, where N is a positive integer. Each of the N wirings is electrically connected to a corresponding quadrilateral region 610 of the sensing electrode layer 530, while any two wirings are not electrically connected.

Figure 10A:
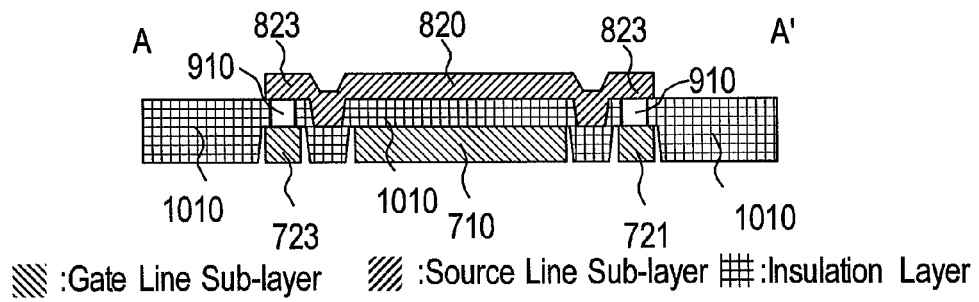
FIG. 10A and FIG. 10B are two cross sectional views taking along A-A' and B-B' lines of FIG. 9, respectively.
Figure 10B:
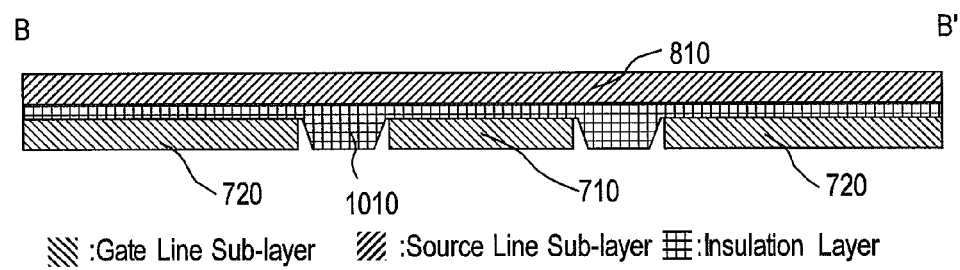

FIG. 10A and FIG. 10B are two cross sectional views taking along A-A' and B-B' lines of FIG. 9, respectively. As shown in FIG. 10A, there is an insulation layer 1010 arranged between the gate line 710 and the second extension part 823 arranged in the second direction. The second extension part 823 arranged in the second direction is electrically connected to the first extension part 721 arranged in the first direction and the second extension part 723 arranged in the first direction through via holes 910. As shown in FIG. 10B, there is an insulation layer 1010 arranged between the gate line 710 and the source line 810.

Figure 11:
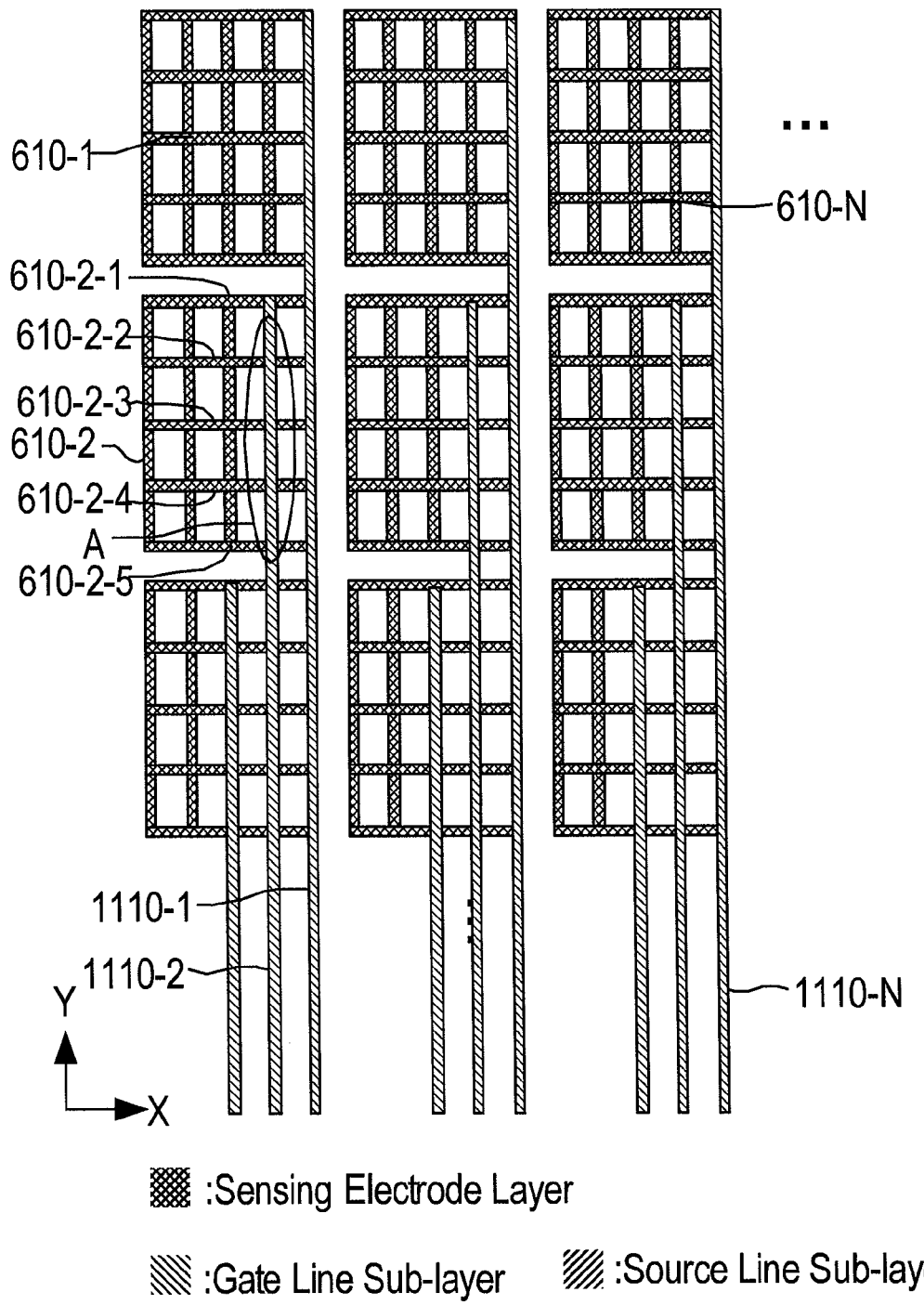
FIG. 11 schematically illustrates the sensing touch pattern structure and wirings in accordance with the present invention.
Figure 12:
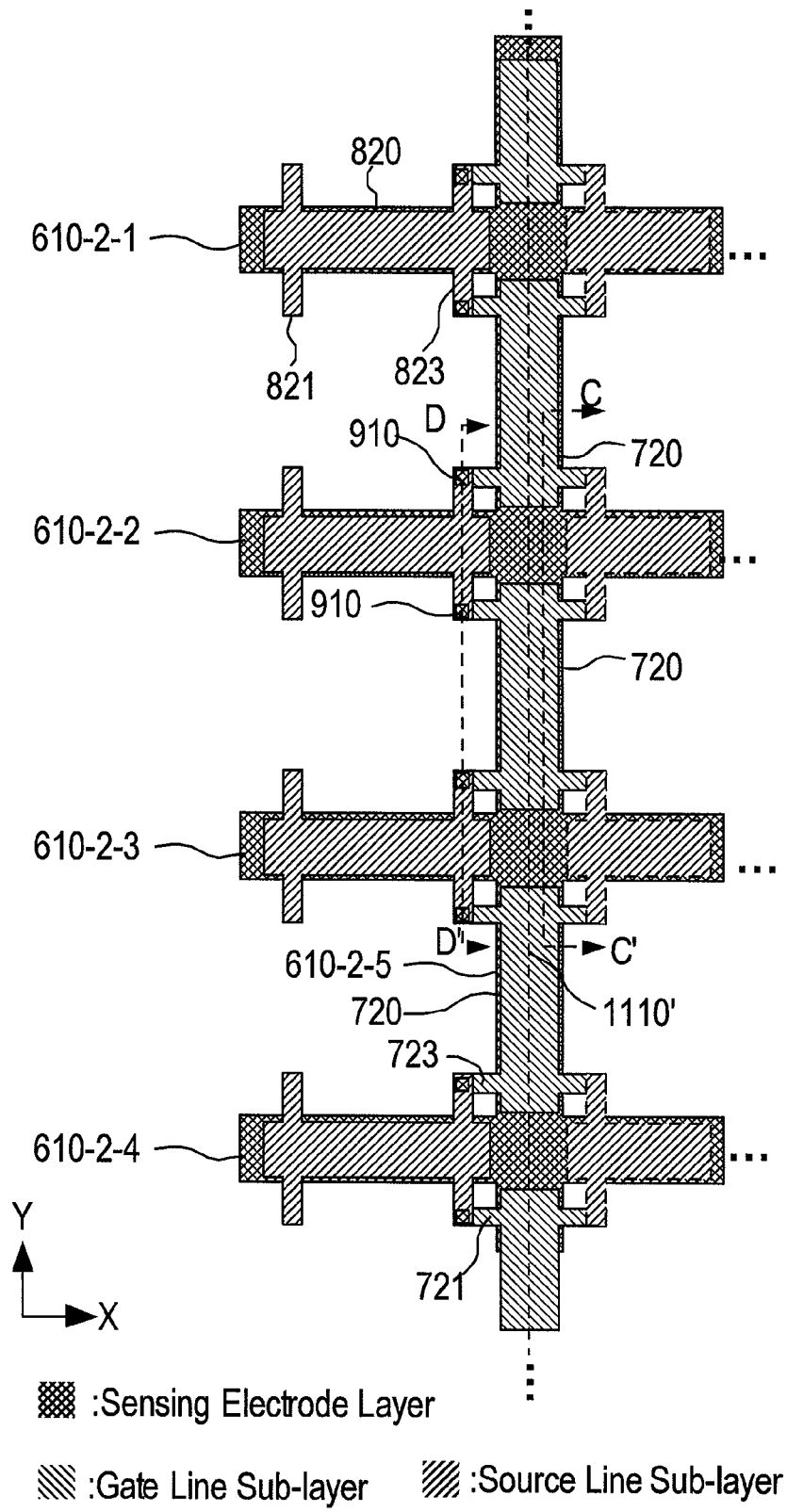
FIG. 12 schematically illustrates the part of FIG. 11 denoted by an oval A.

FIG. 11 schematically illustrates the sensing touch pattern structure and wirings in accordance with the present invention. As shown, the sensing touch pattern structure includes quadrilateral regions 610-1 to 610-N, which correspond to wirings 1110-1 to 1110-N, respectively, wherein the direction of the wirings is the second direction. The quadrilateral region 610-2 is composed of a plurality of sensing conductor lines 610-2-1, 610-2-2, 610-2-3, 610-2-4, 610-2-5, etc. FIG. 12 schematically illustrates the part of FIG. 11 denoted by an oval A, which is viewed from the upper substrate 510 to the lower substrate 520. In this embodiment, the width of the sensing conductor line of the quadrilateral region 610 is the same as the line width of gate line 710. For clearly illustrating the quadrilateral region 610, in FIG. 12, the width of the sensing conductor line of the quadrilateral region 610 is plotted slightly wider than the actual measure and the plurality of gate lines and the plurality of source lines are omitted.

Figure 13A:
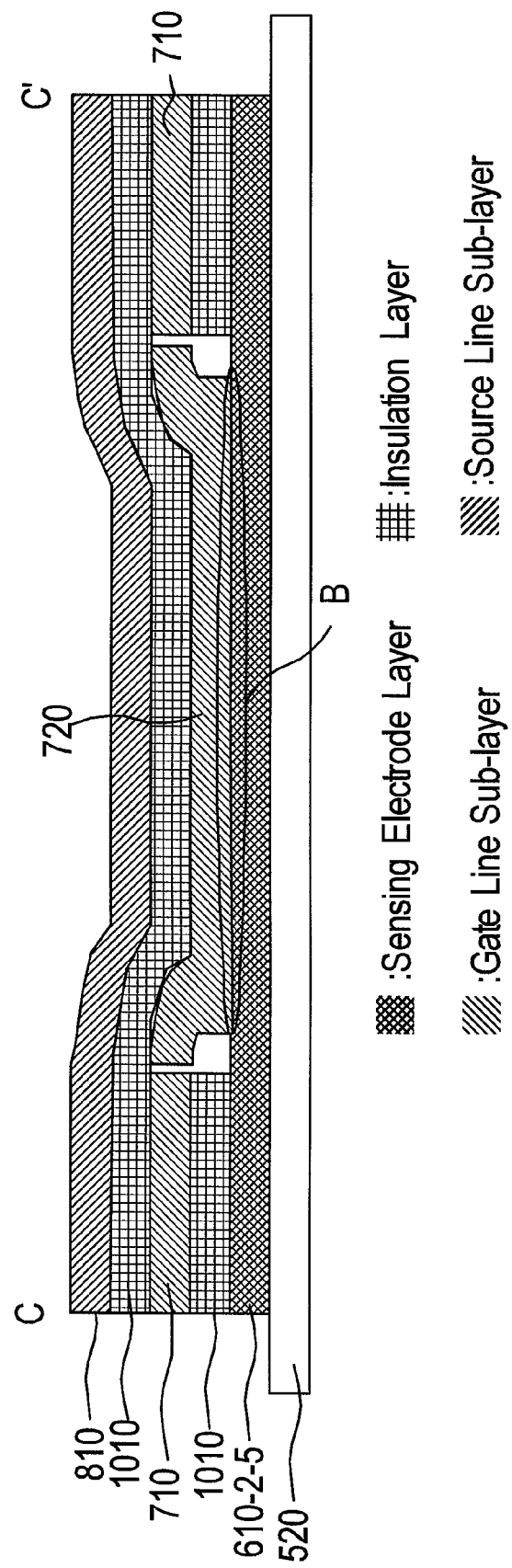
FIG. 13A and FIG. 13B are two cross sectional views taking along C-C' and D-D' lines of FIG. 12, respectively.
Figure 13B:
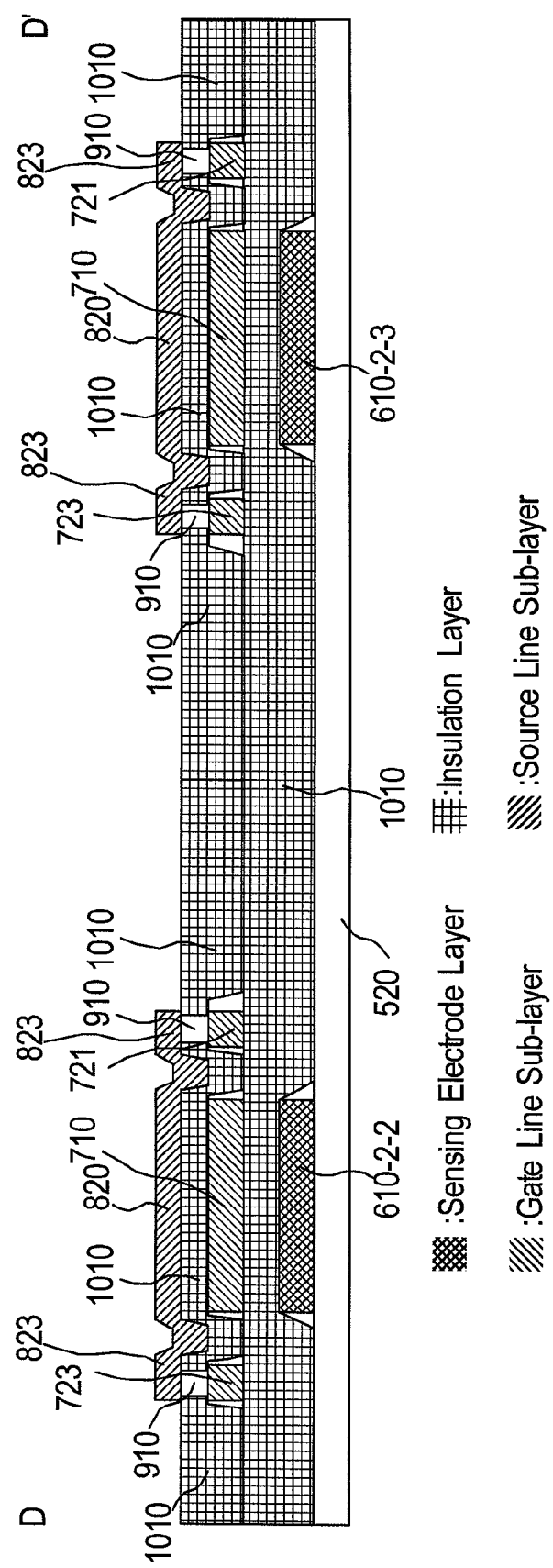

FIG. 13A and FIG. 13B are two cross sectional views taking along C-C' and D-D' lines of FIG. 12, respectively. As shown in FIG. 13A, the quadrilateral region 610 is electrically connected with the wiring segment 720 arranged in the second direction at the place of FIG. 13A denoted by an oval B. As shown in 13B, for the wiring segment 720 arranged in the second direction, the first extension part 721 arranged in the first direction and the second extension part 723 arranged in the first direction are electrically connected to the second extension part 823 arranged in the second direction of the wiring segment 820 arranged in the first direction through the via 910. That is, with manner of using the wiring 1110' arranged in the second direction as shown in FIG. 9, it is able to allow the quadrilateral region 610-2 to transmit the sensed signal to a controller (not shown) through the wiring 1110-2 arranged in the second direction.

Figure 14:
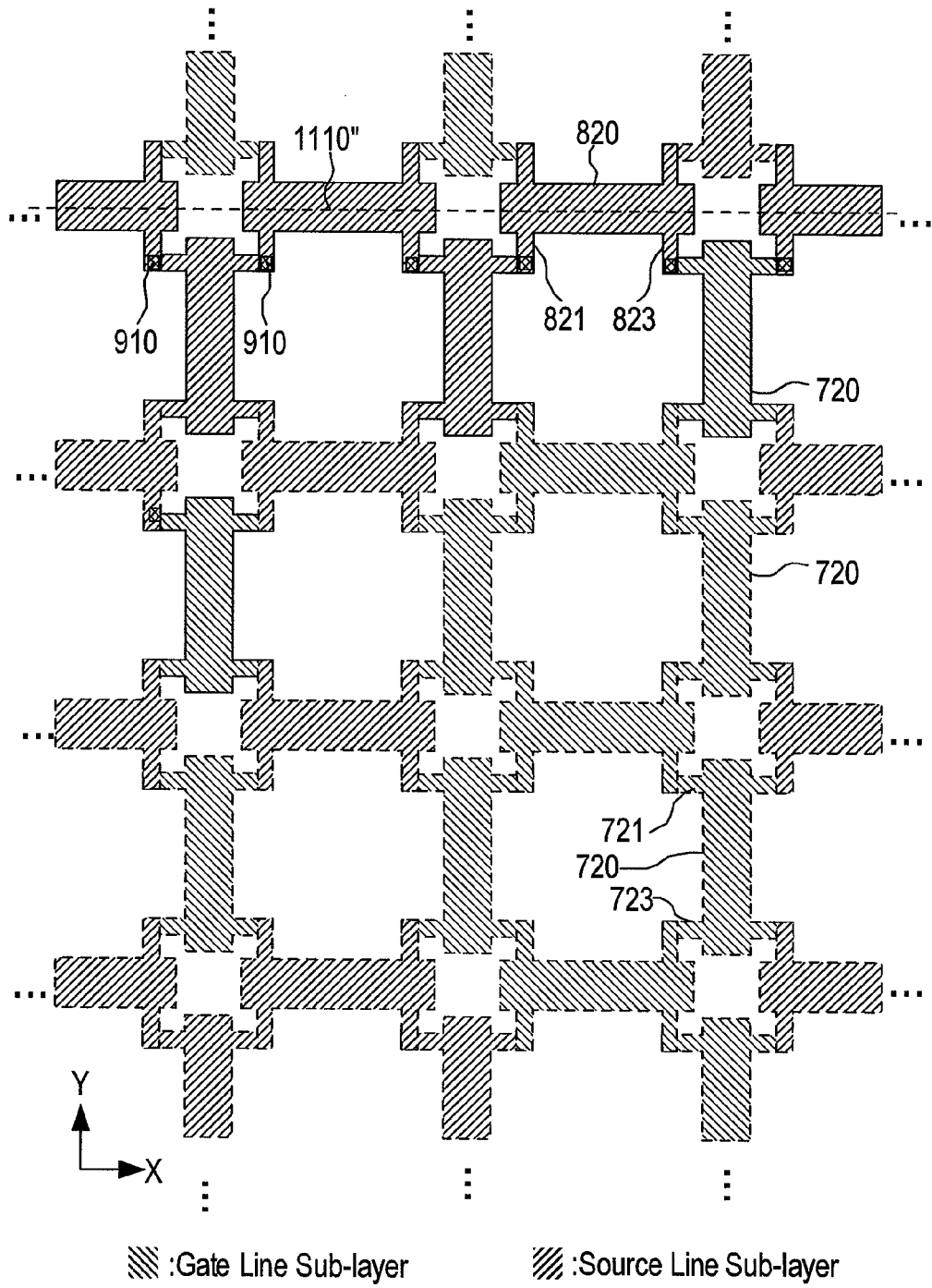
FIG. 14 schematically illustrates the electrical connection between the plurality of wiring segments arranged in the first direction and the plurality of the wiring segments arranged in the second direction in accordance with another embodiment of the present invention.

FIG. 14 schematically illustrates the electrical connection between the plurality of wiring segments 820 arranged in the first direction and the plurality of the wiring segments 720 arranged in the second direction in accordance with another embodiment of the present invention, wherein the extension parts 721, 723, 821, 823 are partially overlapped and electrically connected thereby, so as to allow the plurality of wiring segments 720 arranged in the second direction and the plurality of the wiring segments 820 arranged in the first direction to form the plurality of wirings of the thin film transistor and wiring layer 550. As shown in FIG. 14, there is formed with a wiring 1110" arranged in the first direction.

Figure 15:
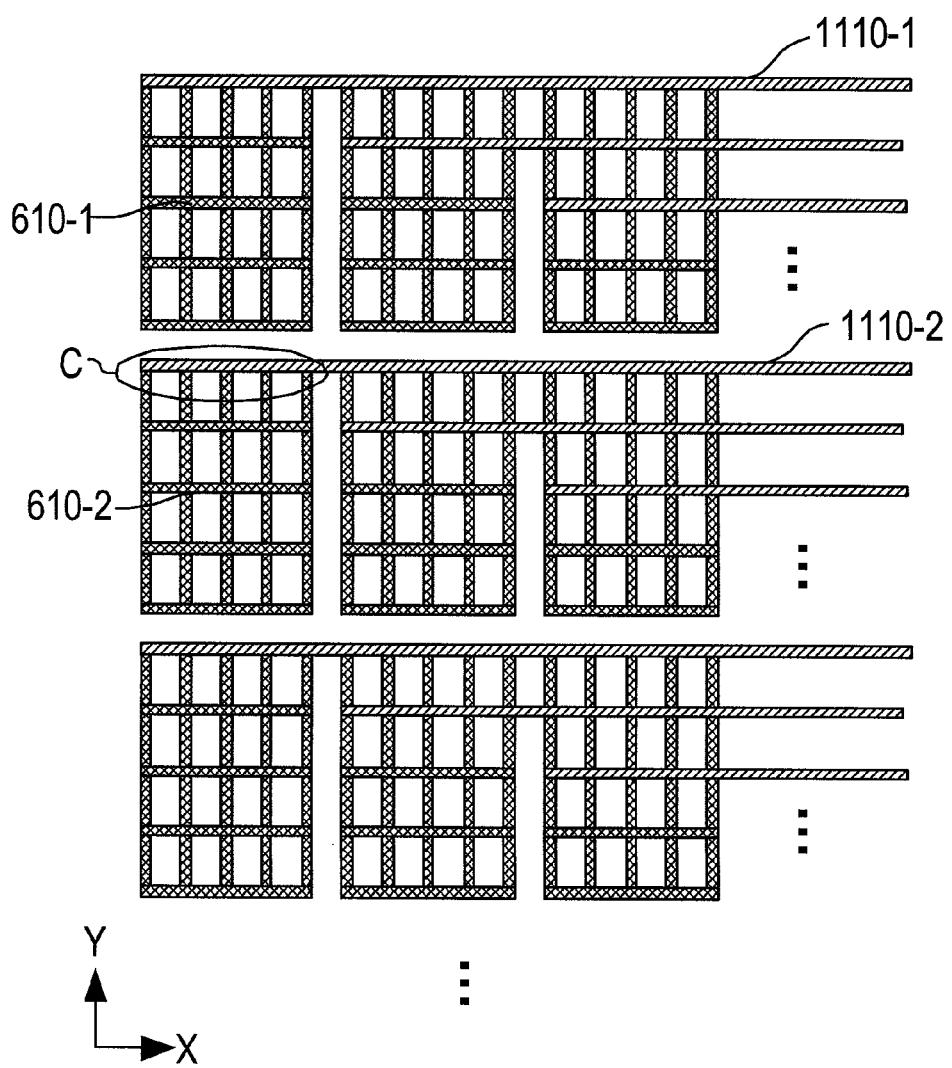
FIG. 15 schematically illustrates the sensing touch pattern structure and wirings in accordance with another embodiment of the present invention.

Similarly, FIG. 15 schematically illustrates the sensing touch pattern structure and wirings in accordance with another embodiment of the present invention. As shown, the sensing touch pattern structure includes quadrilateral regions 610-1 to 610-N, which correspond to wirings 1110-1 to 1110-N, respectively, wherein the direction of the wirings is the first direction. As shown in FIG. 15, the quadrilateral region 610-2 is electrically connected with the plurality of wiring segments 720 arranged in the second direction at the place denoted by an oval C, and transmits the sensed signal to a controller (not shown) through the wiring 1110" arranged in the first direction.

The plurality of sensing conductor lines of the sensing electrode layer 530 and the plurality of wirings of the thin film transistor and wiring layer 550 are made of conductive metal material or alloy material, wherein the conductive metal material is selectively to be chromium, barium, aluminum, titanium, and alloy thereof.

The OLED layer 540 includes a hole transporting layer 541, an emitting layer 543, and an electron transporting layer 545.

In view of the foregoing, it is known that the present invention is capable of forming the plurality of the wiring segments 720 arranged in the second direction and the plurality of wiring segments 820 arranged in the first direction on the thin film transistor and wiring layer 550, so as to form the sensing touch pattern structure on the sensing electrode layer 530 without having to arrange wirings on the sensing electrode layer 530. Accordingly, the gap distance between sensing touch patterns can be effectively reduced thereby decreasing the measure of dead area and increasing sensing linearity and sensing accuracy.

Although the present invention has been explained in relation to its preferred embodiment, it is to be understood that many other possible modifications and variations can be made without departing from the spirit and scope of the invention as hereinafter claimed.

What is claimed is:

1. A high-accuracy OLED touch display panel structure, comprising:
   an upper substrate;
   a lower substrate parallel to the upper substrate;
   an OLED layer configured between the upper substrate and the lower substrate;
   a sensing electrode layer disposed at one side of the lower substrate facing the OLED layer, sensing electrode layer having a plurality of sensing conductor lines for sensing an approaching external object;
   a thin film transistor and wiring layer disposed at one side of the sensing electrode layer facing the OLED layer, the thin film transistor and wiring layer including a plurality of gate lines, a plurality of source lines, and a plurality of wirings for driving a corresponding pixel driving circuit according to a display pixel signal and a display driving signal;
   a cathode layer disposed at one side of the upper substrate facing the OLED layer; and
   an anode layer disposed at one side of the thin film transistor and wiring layer facing the OLED layer, the anode layer including a plurality of anode pixel electrodes, each of the plurality of anode pixel electrodes being connected to a source or drain of a corresponding pixel driving transistor,
   wherein the plurality of sensing conductor lines are disposed corresponding to positions of the plurality of gate lines and the plurality of source lines.

2. The high-accuracy OLED touch display panel structure as claimed in claim 1, wherein the plurality of sensing conductor lines are divided into N quadrilateral regions, where N is a positive integer, the sensing conductor lines in any one of the quadrilateral regions being electrically connected together while the sensing conductor lines in any two quadrilateral regions are not electrically connected, so as to form a single-layered touch pattern structure on the sensing electrode layer.

3. The high-accuracy OLED touch display panel structure as claimed in claim 2, wherein the plurality of wirings are formed with N wirings, each of the N wirings being electrically connected to a corresponding quadrilateral region, while any two wirings are not electrically connected.

4. The high-accuracy OLED touch display panel structure as claimed in claim 3, wherein the plurality of wirings of the thin film transistor and wiring layer are arranged in a first direction and a second direction.

5. The high-accuracy OLED touch display panel structure as claimed in claim 4, wherein the first direction is vertical with the second direction.

6. The high-accuracy OLED touch display panel structure as claimed in claim 5, wherein each of the quadrilateral regions is formed in a rectangle, square, or rhombus shape.

7. The high-accuracy OLED touch display panel structure as claimed in claim 1, wherein the thin film transistor and wiring layer includes:

a gate line sub-layer having a plurality of gate lines and a plurality of wiring segments, the plurality of gate lines being arranged in a first direction and the plurality of wiring segments being arranged in a second direction, the plurality of wiring segments arranged in the second direction are separated by the plurality of gate lines; and a source line sub-layer disposed at one side of the gate line sub-layer facing the OLED layer and having a plurality of source lines and a plurality of wiring segments, the plurality of source lines are arranged in the second direction and the plurality of wiring segments are arranged in the first direction, the plurality of wiring segments arranged in the first direction being separated by the plurality of source lines.

8. The high-accuracy OLED touch display panel structure as claimed in claim 7, wherein the plurality of wiring segments arranged in the second direction and the plurality of wiring segments arranged in the first direction are disposed corresponding to positions of the plurality of gate lines and the plurality of source lines.

9. The high-accuracy OLED touch display panel structure as claimed in claim 8, wherein each of the plurality of wiring segments arranged in the second direction has two ends respectively having a first extension part and a second extension part arranged in the first direction, and each of the plurality of wiring segments arranged in the first direction has two ends respectively having a first extension part and a second extension part arranged in the second direction, where the extension parts arranged in the first direction are partially overlapped with the extension parts arranged in the second direction.

10. The high-accuracy OLED touch display panel structure as claimed in claim 9, wherein the extension parts are partially overlapped and thus electrically connected thereby, so as to allow the plurality of wiring segments arranged in the second direction and the plurality of wiring segments arranged in the first direction to form the plurality of wirings of the thin film transistor and wiring layer.

11. The high-accuracy OLED touch display panel structure as claimed in claim 6, wherein the plurality of sensing conductor lines of the sensing electrode layer and the plurality of wirings of the thin film transistor and wiring layer are made of conductive metal material or alloy material.

12. The high-accuracy OLED touch display panel structure as claimed in claim 6, wherein the conductive metal material is selectively to be chromium, barium, aluminum, titanium, and alloy thereof.

13. The high-accuracy OLED touch display panel structure as claimed in claim 1, wherein the cathode layer is formed with metal material.

14. The high-accuracy OLED touch display panel structure as claimed in claim 13, wherein the metal material is selectively to be combination of aluminum, silver, magnesium, calcium, potassium, lithium, indium, or combination of lithium fluoride, magnesium fluoride, lithium oxide and aluminum.

15. The high-accuracy OLED touch display panel structure as claimed in claim 1, wherein the OLED layer includes a hole transporting layer, an emitting layer, and an electron transporting layer.

\* \* \* \* \*